United States Patent [19]

Gates, Jr.

[11] 4,076,955
[45] Feb. 28, 1978

[54] PACKAGE FOR HERMETICALLY SEALING ELECTRONIC CIRCUITS

[75] Inventor: Louis E. Gates, Jr., Westlake Village, Calif.

[73] Assignee: Hughes Aircraft Company, Culver City, Calif.

[21] Appl. No.: 767,583

[22] Filed: Feb. 10, 1977

Related U.S. Application Data

[63] Continuation of Ser. No. 554,788, Mar. 3, 1975, abandoned.

[51] Int. Cl.² ............................................. H05K 5/06
[52] U.S. Cl. .................................. 174/52 FP; 357/74
[58] Field of Search .............. 174/52 FP, 52 S, 50.5, 174/50.61; 357/74; 29/627, 588–591

[56] References Cited

U.S. PATENT DOCUMENTS

| | | | |
|---|---|---|---|
| 3,302,072 | 1/1967 | O'Neil | 174/52 S |
| 3,337,678 | 8/1967 | Stelmak | 174/52 FP |
| 3,509,430 | 4/1970 | Mroz | 174/52 FP X |
| 3,550,766 | 12/1970 | Nixen et al. | 174/52 FP X |
| 3,753,054 | 8/1973 | Johnson | 174/52 FP X |
| 3,872,583 | 3/1975 | Beall et al. | 174/52 FP X |

Primary Examiner—C. L. Albritton
Assistant Examiner—D. A. Tone
Attorney, Agent, or Firm—Lewis B. Sternfels; W. H. MacAllister

[57] ABSTRACT

A flat pack or a platform type ceramic-metal package for housing large scale integrated (LSI) circuit wafers or hybrid circuits comprises a rectangular, square or circular, flat ceramic base metallized with a pattern of radial leads from the central portion of the package to its periphery. The leads pass out underneath a ceramic ring frame hermetically sealed to the base. The outside of the ring frame is metallized. Alternatively, flat-headed metal pins may be passed through the base. Hermetically brazed to the frame is a Kovar ring or sleeve. The electronic device is bonded inside the ring frame to the package base. Electrical connections from wafer or hybrid circuit pads to lead pads or pins within the ring frame are made by conventional wire bonding techniques. A ceramic lid with rim and the outer portion of its upper surface metallized is attached to the package by soldering to the Kovar ring.

13 Claims, 9 Drawing Figures

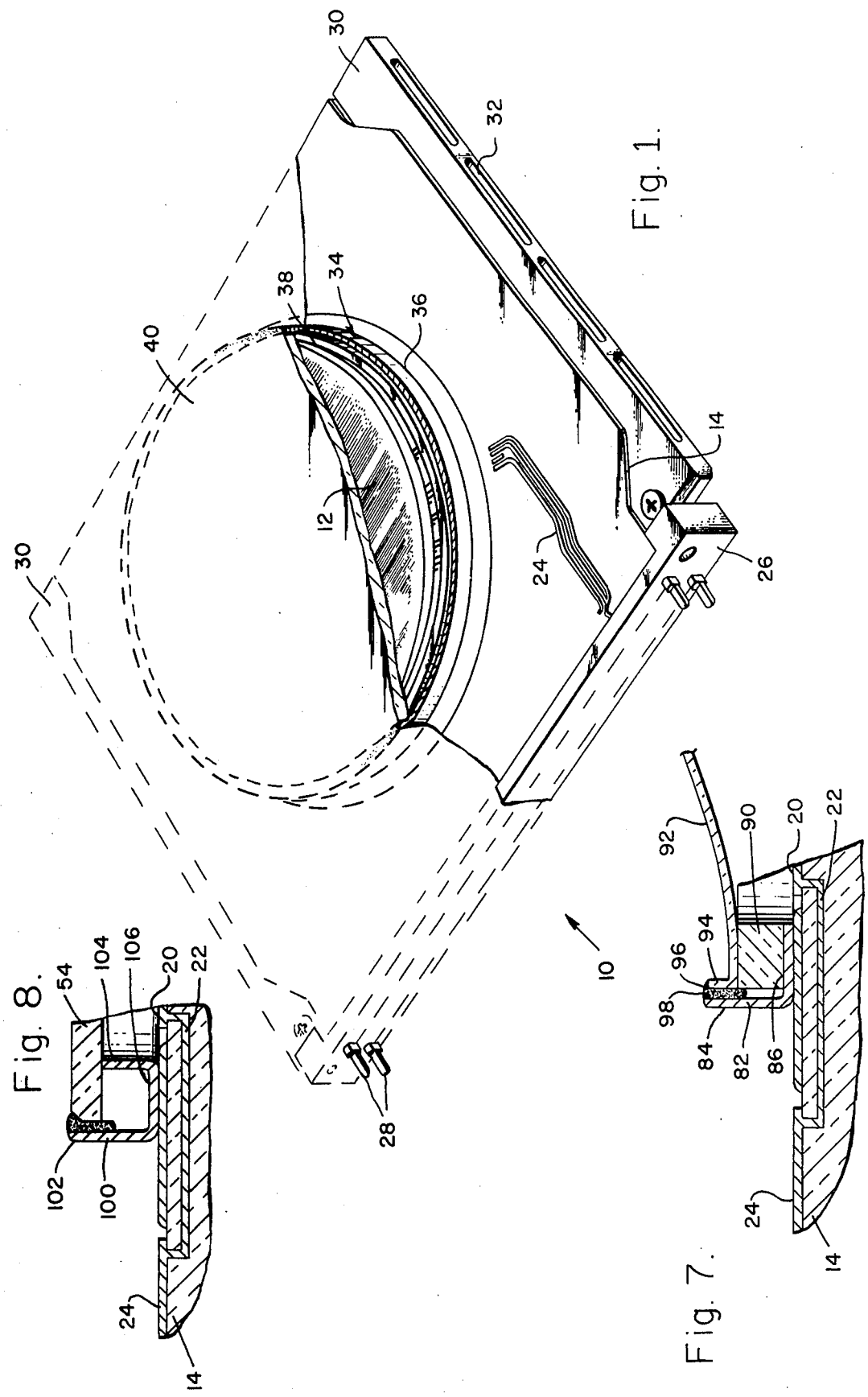

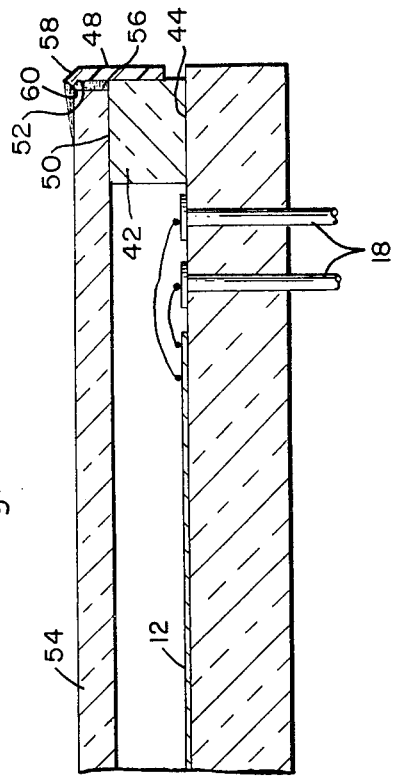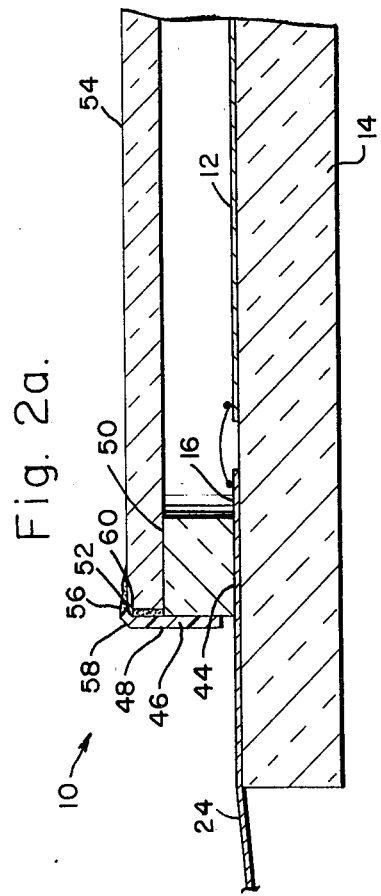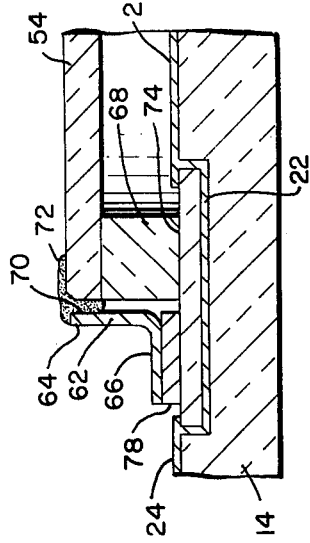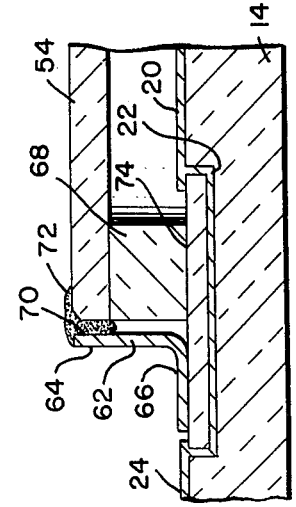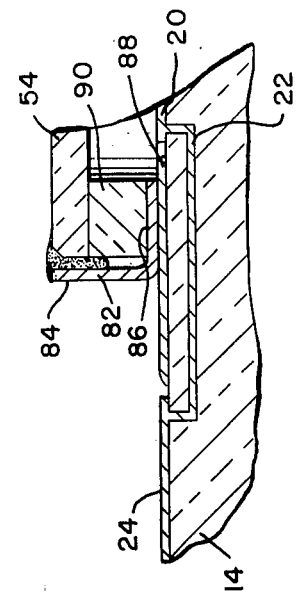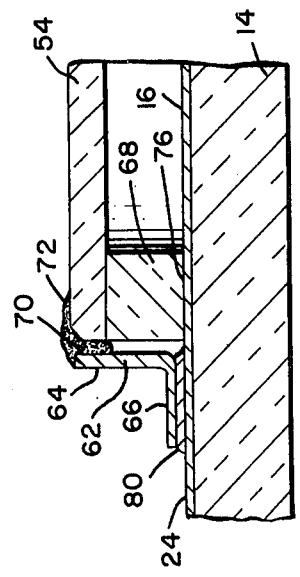

PACKAGE FOR HERMETICALLY SEALING ELECTRONIC CIRCUITS

This is a continuation of application, Ser. No. 554,788 filed Mar. 3, 1975 now abandoned.

BACKGROUND OF THE INVENTION

1. Field of the Invention

The present invention relates to a package for hermetically sealing electronic circuits.

2. Description of the Prior Art

Packages for enclosing electronic circuits, such as hybrid circuit devices and large scale integrated (LSI) wafers, are well known. Hybrid packages for electronic circuits commonly comprise a square or rectangular ceramic-glass-metal construction in which glass layers are used to bond a metal ring frame to a ceramic base and to insulate the frame electrically from leads passing thereunder. A variation of this design utilizes a ceramic ring frame in which the top surface thereof is metallized for soldering. Large scale integrated wafers are generally placed within a circular package having a radial pattern of metallized leads which are overcoated with a glass or ceramic dielectric which, in turn, is overcoated with a solderable metallizing material. Use of glass in a ceramic-metal seal invariably results in a brittle seal which is susceptible to failure from mechanical and thermal shocks.

Package lids for both hybrid electronic circuits and large scale integrated wafers are commonly made of sheet metal which is drawn into a shallow square, rectangular or circular pan. To seal the package, the lip of the lid is butt soldered to a flat sealing area formed at the perimeter of the package. In order to assure adequate hermeticity for long term storage and reliable performance, a smooth solder fillet is formed around the outside of the butt joint.

Some of the problems heretofore encountered with this type of lid and seal include low strength and reliability of a butt solder joint. Although solder tensile strengths typically measure in the range of 3,000 psi to 7,000 psi, under long-term fatigue conditions, solder strength can degrade to 1/10th of its original value. When a package with a metal pan-shaped lid is subjected to atmospheric pressure fluctuations, as may be encountered in an electronic system which is repeatedly carried aloft to high altitudes in an airplane or submerged to great depths in a submarine, the surface of the metal lid deflects appreciably. Such deflections exert cantilever moments on the solder joint and cause seal failure through fatigue in the solder. Reduced atmospheric pressure conditions cause excessive tensile forces to be exerted on the butt solder joint.

Although lid deflection can be reduced by increasing the thickness of the lid, the weight of the package is also increased, which may be an objectionable or an intolerable weight increase, and the thicker metal wall at the butt joint also becomes more difficult to solder. Furthermore, in order to match more closely the thermal expansion of the ceramic base of the hybrid package, the lid is made of an iron-nickel-cobalt alloy marketed under such trademarks as "KOVAR", "THERLO" and "FERNICO". Such alloys are magnetic, which can produce electrical problems with some types of circuitry installed in the electronic package, although use of such alloys to provide magnetic shielding at times is desirable. Nevertheless, conventional seal and lid designs utilizing this alloy for the lid generally create serious problems which affect performance and reliability of the packages.

SUMMARY OF THE INVENTION

The present invention overcomes these and other problems. An electronic circuit, e.g., an LSI wafer or hybrid devices, is positioned or secured to a base. A sealing ring enclosure surrounding the electronic circuit is hermetically sealed to the base and is provided with a sealing area above the electronic circuit so that a lid may be hermetically sealed to the sealing area.

In its preferred embodiment, the sealing ring enclosure comprises a separate ceramic ring and an exterior metal flange which permits the lid to rest on the ring and to be sealed to the flange at the sealing area thereon. The flange may be bonded to the ring or, alternatively, to the base. When the hermetic seals comprise brazing, it is preferred that the ring is ceramic which rests on a portion of the flange, which, in turn, rests on the base to form a sandwich structure that is brazed together so as to provide not only a spacer but also a means for equalizing any stresses in the metal flange resulting from the brazing. The lid, although preferred to be of ceramic, may be of metal having a domed configuration. In either case, all elements are preferred to have essentially the same coefficient of thermal expansion to minimize stresses between or within the seal elements which might otherwise result from relative thermal expansion of differing materials.

It is, therefore, an object of the invention to provide for a hermetic seal for electronic circuits, such as hybrid electronic circuits and LSI wafers.

Another object is to provide for long term protection of electronic devices from extreme pressure fluctuations and atmospheric contaminations.

Another object is to provide for a sealing design which employs existing conventional equipment and techniques.

Another object is to provide for a package lid which does not exert cantilever moments, or tensile or shear forces on a hermetic seal.

Another object is to provide for a package having a relatively rigid lid which resists appreciable deflection upon exposure thereof to atmospheric pressure fluctuations.

Another object is to provide for low profile height of a package assembly while maximizing the interior clearance height for circuit components.

Another object is to provide for low cost, simple and reliable construction.

Another object is to provide for a readily positionable, removable and replaceable lid with minimized destruction of enclosed electronic components.

Other aims and objects as well as a more complete understanding of the present invention will appear from the following explanation of exemplary embodiments and the accompanying drawings thereof.

BRIEF DESCRIPTION OF THE DRAWINGS

FIG. 1 illustrates the invention in perspective exemplified as a package for an LSI wafer;

FIGS. 2a and 2b are alternate embodiments of the present invention showing different lead configurations but utilizing a similar packaging embodiment; and FIGS. 3–8 depict several modifications of the present invention on various types of supporting buses.

DESCRIPTION OF THE PREFERRED EMBODIMENTS

Accordingly, FIG. 1 depicts a module 10 for supporting an illustrative large scale integrated wafer 12 which, as shown in FIGS. 2a and 2b, is mounted on a support or base 14. Substrate 14 may be formed of any suitable material and is preferably formed of a ceramic material.

Substrate 14 generally comprises a printed wiring board having wiring connections configured in one of several ways, such as configured as shown in FIGS. 2a–8, e.g., surface radial leads 16 (FIGS. 2a and 5), flat-headed metal pins 18 passing through the ceramic base (FIG. 2b), or the combination of surface leads 20 and subsurface leads 22 (FIGS. 3, 4 and 6–8). Regardless of the specific configuration, leads 16, 20 and 22 are coupled to exterior surface leads 24 which extend along the surface of base 14 for coupling to a receptacle connector 26 having a plurality of pins 28 for interconnecting module 10 into a total system function.

Only a few of these leads 24 and pins 28 are illustrated in FIG. 1; however, it is to be understood that the entire surface of base 14 is covered with leads extending to a plurality of pins 28 in receptacle 26.

Ceramic base 14 is secured to frame 30 in any convenient manner such as by adhesive bonding. Frame 30 is secured to receptacle 26 by machine screws. Lead tabs from receptacle 26 are soldered directly to conductor pads terminating leads 24 on ceramic base 14. Attached to the reverse side of base 14 is a cooling fan system (not shown), extending from one side of the frame to the other. The cooling system, including cooling fins, frame 30 and coolant ducts 32 as well as their combination with other modules into a total system assembly is described in patent application Ser. No. 554,789 (copending with the parent of this application), now U.S. Pat. No. 4,006,388 dated Feb. 1, 1977, and entitled "Thermally Controlled Electronic System Package" by Wesley E. Bartholomew and assigned to the assignee of the present invention.

In order to seal wafer 12 or equivalent hybrid or other electronic circuit devices within a hermetically sealed package, a sealing ring construction 34 is hermetically bonded to base 14 on a metallized sealing area 36 thereon. The height of the sealing ring construction is such that it extends above the surface of LSI wafer 12 or the hybrid circuit devices and is provided with a lid sealing area 38 to which a lid 40 is hermetically bonded. Such a sealing ring construction 34 with its lid 40 hermetically bonded thereto and its hermetically bonded connection to base 14 at metallized sealing area 36 is generally depicted in FIG. 1, with the several modifications of particular wafer or hybrid circuit hermetic packaging being illustrated in FIGS. 2a–8.

As shown in FIGS. 2a and 2b, one specific hermetically sealed package comprises a ring 42, such as of ceramic, which is bonded, such as by brazing, to base 14 at 44. Ceramic ring 42 is metallized at its outer periphery 46 which enables a metal ring or flange 48, such as of "KOVAR", to be brazed thereto. As shown, flange 48 extends upwardly above upper surface 50 of ceramic ring 42 to provide a lid sealing area 52. A lid 54, such as of ceramic material, of slightly less diameter than that of flange 48 is placed on surface 50 of ring 42 which, therefore, provides a seat or rest for the lid. Lid 54 is bonded to sealing area 52 of flange 48 in any suitable matter, such as by soldering to provide a solder fillet 56. Flange 48 may be rolled over at 58 to improve the package seal strength, and enhancement of the mechanical interlocking may be afforded by chamfering the upper edge of lid 54 at 60.

A modification of the sealing construction is depicted in FIGS. 3–5 in which a ring or flange 62 is provided with a L-shaped cross-sectional configuration with an upstanding portion 64 and a base portion 66 extending outwardly from seal ring 68 and the interior of the package which houses LSI wafer 12 or the hybrid circuit. In these modifications, ring flange 62 is preferably spaced from seal ring 68 and is bonded at its lid sealing area 70 to lid 54 by means such as by a solder fillet 72. In this embodiment, seal ring 68 is brazed or otherwise hermetically bonded to ceramic base 14 either directly at 74 (FIGS. 3 and 4) or over leads 16 at 76 (FIG. 5), in a manner similar to that shown in FIG. 2a. The bonding of outwardly extending portion 66 may be directly to the surface of base 14 (FIG. 3) or through the intermediary of a ceramic spacer 78 (FIG. 4) or, when leads 16 or 24 exist, to conformal dielectric spacer coating material 80 (FIG. 5) to provide suitable electrical insulation.

A further modification is illustrated in FIGS. 6 and 7 in which a flange ring 82, having another L-shaped cross-sectional configuration, is provided with an upstanding portion 84 and a base portion 86 which is inwardly turned toward the interior of the package. In this configuration, upstanding portion 84 is secured to the lid 54 (FIG. 6) in a manner similar to that described with respect to FIGS. 3–5. In both configurations depicted in FIGS. 6 and 7, inwardly extending portion 86 is bonded directly to or through a conformal dielectric coating material 88 to base 14. Also, ceramic ring 90 is brazed to portion 86 at its upper surface to form a sandwich construction. This sandwich construction of ceramic ring 90, portion 86 and base 14 is preferred when it is desired that ceramic ring 90 provides the double duty of acting not only as a spacer for lid 54 but also as an equalizer of stresses in the metal which may otherwise occur from a brazing operation.

It is to be understood, of course, that in the configurations of FIGS. 3–5, a further ceramic ring may be placed on the upper surface of portion 66 to afford a similar result in order to equalize brazing stresses.

FIG. 7 also illustrates a further modification of the present invention when it is desired that the lid not be made of a ceramic material but of metal for purposes, for example, of magnetic shielding. In this modification, lid 92 has a domed configuration with the dome extending upwardly above the circuit so that any pressure excursions will not cause the lid to touch LSI wafer 12 or the hybrid circuit thereunder. Further, in this configuration depicted in FIG. 7, lid 92 is provided with an upturned edge 94 which is secured, such as by solder 96, to lid sealing area 98 on flange 82. This configuration permits flange 82 and upturned edge 94 to pivot during pressure excursions of lid 92 without seriously affecting solder bond 96.

Still another embodiment of the present invention is shown in FIG. 8 in which a flange 100 has a U-shaped cross-sectional configuration including a pair of upstanding portions 102 and 104 joined by a connecting base portion 106. Portion 106 is bonded, such as by brazing, to base 14 with upstanding portion 102 being bonded to lid 54 in a manner similar to that previously described. Upstanding portion 104 is utilized in place of a ceramic ring, such as ring 90 of FIGS. 6 and 7.

In one or more of the above embodiments, the preferred materials are ceramic and metal alloy for the seal ring elements which are hermetically brazed to each other and to a metallized sealing area on the base for the hybrid circuit or LSI wafer. The metal alloy seal ring element, in the preferred embodiments, comprises a metal whose coefficient of thermal expansion closely matches that of the ceramic comprising the base. The ceramic seal ring and lid are also preferably of essentially the same ceramic composition as the base; however, as noted above, the lid may also be of metal providing it reasonably matches the thermal expansion of the ceramic composition and is of a geometry which is compatible with the mechanical design requirements of the seal.

The elimination of the ceramic ring, as depicted in FIG. 8, may result in a slight sacrifice in mechanical performance of the final package as lacking the balancing of stresses which sometimes occur during brazing; however, such sacrifice may be offset by a decrease in the cost of materials and processing.

Sealing of the lid to the flange may be made with a conventional soldering iron by conventional seam sealing techniques, thereby overcoming many of the detailed processing disadvantages of the prior art. The solder is melted and flowed into the gap between the vertical edge of the lid and the vertical inside diameter of the ring flange and, when a uniform fillet is obtained around the periphery of the lid, a reliable seal is accomplished. Since the lid, when made of ceramic, is flat and rigid, upon reduction of external pressure on the sealed package, a negligible rotational moment is exerted on the solder joint, resulting in pure shear forces. When the hermetically sealed package is subjected to high external atmospheric pressure, the lid center is deflected inwardly toward the electronic circuit but, since the lid is rigid and is fully supported by the ceramic ring 42, 68 or 90 or by upstanding portion 104 of FIG. 8, the actual forces exerted on the solder joint are also negligible, especially in comparison with the prior art in which the edge of a pan-shaped metal lid is butt soldered onto the seal ring area on the substrate surface, resulting in excessive tensile forces which are exerted on the solder seal. In the present invention, on the other hand, the pressure force is translated into a shear force rather than the aforementioned tensile force and the shear force is further distributed over a larger surface area to effect a reduction in the unit shear stress imposed upon the solder joint.

The metallized sealing surface on the package is of conventional centered refractory metal, e.g. tungsten or molybdenum, provided by well known ceramic electron tube and electronic circuit package manufacturing processes.

The height of the seal and the lid above the electronic circuit are designed to maintain a minimum height profile for the module, while retaining a satisfactory height within the device or wafer mounting cavity to assure that there is adequate space to mount the circuit assembly wafer and with sufficient clearance to make any wire bond repairs on its top surface.

An analysis was made to determine the stress developed on the solder joint if a large package utilizing the seal of the present invention was subjected to a pressure differential of minus 1 atmosphere. In this analysis, it was assumed that an active electronic circuit, such as a transistor network, or an LSI wafer was sealed in the package at an ambient pressure of 1 atmosphere. When the package is carried aloft to an altitude of 80,000 feet, for example, there will be imposed on the package essentially 1 atmosphere negative pressure. By virtue of the internal gas pressure, an outward force will be developed on the lid which will tend to remove it. The force will be manifested by its shear stress in the solder joint, as shown by the equation:

$$S = pr/2t,$$

where $S$ is stress, $p$ is pressure, $r$ is lid radius, and $t$ is the lid thickness. For a seal with an approximate outside diameter of 3 inches (7.56 cm), a metal ring thickness of 0.015 inch (0.038 cm), and a solder joint thickness of 0.004 inch (0.011 cm), the lid radius will be 1.48 inches (3.76 cm). At a pressure differential of 14.7 psi (0.103 kg/cm$^2$) and a lid thickness of 0.050 inch (0.127 cm), from the above equation, $S$ is 218 psi (15.3 kg/cm$^2$). Allowable shear stress for soft solder, such as Sn 96, is nominally 2,000 psi (145 kg/cm$^2$). Thus, the stress imposed on the solder joint is less than 1/9 the allowable design stress. In actual tests of a sealed package, the solder joint withstood repeated pressure reduction cycles from ambient pressure without any signs of failure or loss of hermeticity.

A number of LSI wafer packages utilizing the present invention were leak tested with a conventional helium mass spectrometer. The package was subjected to numerous temperature cycles, specifically, a thermal conditioning process consisting of maintaining the package at a temperature of 85° C for a minimum of 24 hours. Thereafter, the sealed package was subjected to 10 thermal cycles, each involving cooling it from room temperature to −55° C for 10 minutes duration and thence from room temperature to 85° C for another 10 minute duration and finally back to room temperature. Electric power was also applied to the LSI wafer through the package circuitry for a "burn-in" period of at least 24 hours. It was estimated that this operation caused the package to be heated to about 85° C. After undergoing the above tests, the seal remained hermetic and showed no measurable leakage within the calibration limits of the mass spectrometer, i.e., in the range of $1 \times 10^{-8}$ atm-cc/sec helium leakage rate. Other tests, not using a mounted LSI wafer, showed that the package seal remained leak free after thermal cycling over a range of −55° C to 125° C.

Accordingly, tests showed a successful working of the invention.

Although the invention has been described with reference to particular embodiments thereof, it should be realized that various changes and modifications may be made therein without departing from the spirit and scope of the invention.

What is claimed is:

1. A hermetically sealed package for housing an electronic device, comprising:
    a base for supporting the electronic device and having a sealing area on said base for describing an enclosure for completely surrounding the electronic device, electrical conductors connectable to the electronic device and extending under said sealing area for electrically coupling the electronic device into an electronic system;
    means hermetically bonded to said base sealing area and extending above and completely around said base sealing area for enclosing the electronic device, said means including a lid sealing area extending substantially perpendicular to said base and facing substantially inwardly of said means;

a lid having a peripheral surface extending substantially perpendicular to said base, facing outwardly of said described enclosure and spaced from said lid sealing area for defining a gap located between said surface and said lid sealing area and extending substantially perpendicular to said base; and solder in the gap and hermetically bonding said lid sealing area to said lid peripheral surface, the location of the gap thereby encouraging the exertion of at least shear forces on the bonding of said solder and thereby substantially avoiding exertion of cantilever and tensile forces between said lid and said means and therefore on said solder, and for enabling removal and replacement of said lid from said means while avoiding at least thermal harm to the electronic device.

2. A package as in claim 1 wherein said base, said sealing ring means, and said lid comprise materials having substantially matching coefficients of thermal expansion.

3. A hermetically sealed package for housing an electronic device comprising:

a base having a portion for supporting the electronic device and having a metallized sealing area on said base for completely surrounding said electronic device supporting portion, electrical conductors connectable to the electronic device and extending under said metallized sealing area for electrically coupling the electronic device into an electronic system;

means including a seal ring and a flange hermetically bonded to said metallized sealing area and extending above and completely around said base sealing area for enclosing said electronic device supporting portion and for providing a lid sealing area facing substantially inwardly thereof, said lid sealing area terminating said flange and extending above said seal ring on the outside thereof with respect to the electronic device for providing thereby a support defined by said seal ring and an enclosure defined by said lid sealing area of said flange;

a lid resting on said seal ring and having a peripheral sealing surface facing substantially outwardly of said electronic device supporting portion, said lid sealing surface being spaced from said flange by a gap; and solder placed in the gap and between said flange and said lid and hermetically bonding and sealing said lid sealing area to said lid, in which said lid sealing area, said peripheral sealing surface and said solder therebetween form a sandwich structure substantially parallel to a plane generally perpendicularly disposed to said base for enabling at least shear forces to be exerted on said sandwich structure and thereby for avoiding exertion of cantilever and tensile forces between said flange and said lid and therefore on said solder and for enabling repair of said enclosure without harm to the electronic device.

4. A package as in claim 3, wherein said seal ring is hermetically bonded to said metallized sealing area and said flange is hermetically bonded to said seal ring.

5. A package as in claim 3 wherein said sealing ring means is brazed to said metallized sealing area.

6. A hermetically sealed package enclosing an electronic device, comprising:

a base supporting said electronic device and having a metallized sealing area on said base completely surrounding said electronic device, electrical conductors connected to said electronic device and extending under said metallized sealing area for electrically coupling said electronic device into an electronic system;

means defining a sealing ring hermetically bonded to said metallized sealing area and extending above and completely around said base and said electronic device for providing a lid sealing area, said sealing ring means comprising a flange of substantially U-shaped configuration having a pair of upstanding portions extending away from said base and a portion connecting said upstanding portions hermetically bonded to said metallized sealing area, a first of said upstanding portions extending further outwardly from said base and from said electronic device than a second of said upstanding portions and providing an enclosure defined by said lid sealing area, said second of said upstanding portions providing a lid supporting means; and a lid resting on said lid supporting means and hermetically bonded to said lid sealing area of said sealing ring means for avoiding exertion of cantilever and tensile forces therebetween.

7. A hermetically sealed package for enclosing an electronic device, comprising:

a base for supporting the electronic device and having a sealing area on said base for completely surrounding the electronic device, electrical conductors connectable to the electronic device and extending under said base sealing area for electrically coupling the electronic device into an electronic system;

means including a sealing ring hermetically bonded to said base sealing area and extending above and completely around said base sealing area for enclosing the electronic device and for providing a lid sealing area facing substantially inwardly of said means; and a lid having an outwardly facing peripheral surface hermetically bonded by solder to said lid sealing area of said means for avoiding exertion of cantilever and tensile forces therebetween, and for enabling removal of said lid from said means, thereby at least for avoiding thermal harm to the electronic device, said lid further including a chamfered edge at substantially its uppermost peripheral edge at which said solder is bonded to said lid and to said lid sealing area, and said lid sealing area being rolled towards said chamfered edge and over said solder bond for providing an enhanced mechanical interlock between said lid and said lid sealing area and for enabling compressive forces to be exerted on the hermetic bonding and said solder therebetween when said lid is caused to flex.

8. A hermetically sealed package for housing an electronic device comprising:

a base having a portion for supporting the electronic device and having a metallized sealing area on said base for completely surrounding said electronic device supporting portion, electrical conductors connectable to the electronic device and extending under said metallized sealing area for electrically coupling the electronic device into an electronic system;

means including a seal ring and a flange, said seal ring having a portion extending outwardly therefrom which is hermetically bonded to said metallized sealing area, and said flange being hermetically bonded to said seal ring, having an L-shaped cross-sectional configuration with an upstanding portion adjacent said seal ring, and extending above and completely around said base sealing area for enclosing said electronic device supporting portion and for providing a lid sealing area facing substantially inwardly thereof, said lid sealing area terminating said flange and extending above said seal ring on the outside thereof with respect to the electronic device for providing thereby a support defined by said seal ring and an enclosure defined by said lid sealing area of said flange;

a lid resting on said seal ring and having a peripheral sealing surface facing substantially outwardly of said electronic device supporting portion, said lid sealing surface being spaced from said flange by a gap; and solder placed in the gap and between said flange and said lid and hermetically bonding and sealing said lid sealing area to said lid, in which said lid sealing area, said peripheral sealing surface and said solder therebetween form a sandwich structure generally perpendicular to said base for avoiding exertion of cantilever and tensile forces between said flange and said lid and therefore on said solder and for enabling repair of said enclosure without harm to the electronic device.

9. A package as in claim 8 wherein said electrical conductors extend along the surface of said base and further including a conformal dielectrical coating separating and electrically insulating said outwardly extending flange portion from said electrical conductors.

10. A hermetically sealed package for housing an electronic device comprising:

a base having a portion for supporting the electronic device and having a metallized sealing area on said base for completely surrounding said electronic device supporting portion, electrical conductors connectable to the electronic device and extending under said metallized sealing area for electrically coupling the electronic device into an electronic system;

means including a seal ring and a flange hermetically bonded to said metallized sealing area and extending above and completely around said base sealing area for enclosing said electronic device supporting portion and for providing a lid sealing area facing substantially inwardly thereof, said lid sealing area terminating said flange and extending above said seal ring on the outside thereof with respect to the electronic device for providing thereby a support defined by said seal ring and an enclosure defined by said lid sealing area of said flange, said flange having an L-shaped cross-sectional configuration comprising an upstanding portion adjacent to said seal ring and terminated by said lid sealing area and a portion extending inwardly under said seal ring toward the electronic device, said inwardly extending flange portion being hermetically bonded to said metallized sealing area and to said seal ring;

a lid resting on said seal ring and having a peripheral sealing surface facing substantially outwardly of said electronic device supporting portion, said lid sealing surface being spaced from said flange by a gap; and solder placed in the gap and between said flange and said lid and hermetically bonding and sealing said lid sealing area to said lid, in which said lid sealing area, said peripheral sealing surface and said solder therebetween form a sandwich structure generally perpendicular to said base for avoiding exertion of cantilever and tensile forces between said flange and said lid and therefore on said solder and for enabling repair of said enclosure without harm to the electronic device.

11. A package as in claim 10 wherein said electrical conductors extend along the surface of said base and further including a conformal dielectric coating separating and electrically insulating said inwardly extending flange portion from said electrical conductors.

12. A package as in claim 10 wherein said base and said seal ring comprise ceramic, and said hermetically bonding comprises brazing, for equalizing any stresses formed by said brazing.

13. A hermetically sealed package for housing an electronic device comprising:

a base having a portion for supporting the electronic device and having a metallized sealing area on said base for completely surrounding said electronic device supporting portion, electrical conductors connectable to the electronic device and extending under said metallized sealing area for electrically coupling the electronic device into an electronic system;

means including a seal ring and a flange hermetically bonded to said metallized sealing area and extending above and completely around said base sealing area for enclosing said electronic device supporting portion and for providing a lid sealing area facing substantially inwardly thereof, said lid sealing area terminating said flange and extending above said seal ring on the outside thereof with respect to the electronic device for providing thereby a support defined by said seal ring and an enclosure defined by said lid sealing area of said flange;

a lid comprising means for defining a dome extending over the electronic device and resting on said seal ring, said lid having an upturned peripheral sealing edge extending away from said base and facing substantially outwardly of said electronic device supporting portion, said upturned peripheral sealing edge being spaced from said flange by a gap and being hermetically bonded to said lid sealing area of said sealing ring means; and solder placed in the gap and between said flange and said lid and hermetically bonding and sealing said lid sealing area to said lid, in which said lid sealing area, said peripheral sealing surface and said solder therebetween form a sandwich structure generally perpendicular to said base for avoiding exertion of cantilever and tensile forces between said flanges and said lid and therefore on said solder and for enabling repair of said enclosure without harm to the electronic device.

* * * * *